(12) United States Patent
Yanai et al.

(10) Patent No.: US 7,923,380 B2
(45) Date of Patent: Apr. 12, 2011

(54) SUBSTRATE PROCESSING APPARATUS AND SUBSTRATE PROCESSING METHOD

(75) Inventors: Hidehiro Yanai, Toyama (JP); Masakazu Sakata, Toyama (JP); Akira Takahashi, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/585,342

(22) Filed: Sep. 11, 2009

(65) Prior Publication Data
US 2010/0068895 A1    Mar. 18, 2010

(30) Foreign Application Priority Data

Sep. 17, 2008 (JP) ................................. 2008-237859
Jul. 31, 2009 (JP) ................................. 2009-179590

(51) Int. Cl.
*H01L 21/31* (2006.01)
*H01L 21/469* (2006.01)

(52) U.S. Cl. ........ 438/770; 438/710; 438/758; 438/789; 257/E21.17; 118/500; 118/506; 118/728

(58) Field of Classification Search .................. 438/770, 438/710, 758, 789; 118/500; 257/E21.17
See application file for complete search history.

(56) References Cited

U.S. PATENT DOCUMENTS

| 2002/0034595 A1* | 3/2002 | Tometsuka ..................... 427/569 |
| 2005/0170668 A1* | 8/2005 | Park et al. ..................... 438/789 |

FOREIGN PATENT DOCUMENTS

| JP | A-7-127625 | 5/1995 |
| JP | A-11-111820 | 4/1999 |
| JP | A-2006-24837 | 1/2006 |
| JP | A-2006-86180 | 3/2006 |

OTHER PUBLICATIONS

Aug. 30, 2010 Office Action issued in Japanese Patent Application No. 2009-179590 (with translation).

* cited by examiner

*Primary Examiner* — Alexander G Ghyka
*Assistant Examiner* — Abdulfattah Mustapha
(74) *Attorney, Agent, or Firm* — Oliff & Berridge, PLC (57) ABSTRACT

A substrate processing apparatus includes a processing chamber that processes a substrate, and a substrate placing base enclosed in the processing chamber, and a substrate transporting member that allows the substrate to wait temporarily on the substrate placing base, and exhaust holes provided so as to surround the substrate placing base, and a retracting space that allows the substrate transporting member to move in between lines each connecting the exhaust hole and an upper end of the substrate placing base and the substrate placing base.

6 Claims, 9 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method.

2. Description of the Related Art

As an example of the substrate processing apparatus, wafers are transported in the order of a load port, a load lock chamber, a transporting chamber, and processing chambers, and are processed in the processing chambers.

The processing chambers are independent spaces each shielded by a gate valve, and in the respective chambers, the wafers are processed independently.

In general, in a configuration in which the processing is performed on a susceptor, one wafer only is processed in one chamber. JP-A-2006-86180 discloses a technology to transport unprocessed wafers to the processing chambers alternately, and replace the processed wafers with unprocessed wafers to be processed next when the processed wafers are returned from the respective processing chambers to a processed wafer substrate supporting member.

The substrate processing apparatus in the related art has a configuration including two load rock chambers in which the wafers are placed in stock, one transporting chamber having a robot that transfers the wafers to the respective chambers, and two processing chambers in which the wafers are processed. According to the configuration of this apparatus, it is difficult to exceed a throughput of 200 pieces per hour. In order to aim a higher throughput, improvement of the throughput is possible simply by adding processing chambers in the outer peripheral portion of the transporting chamber. However, since the transporting robot in the transporting chamber is relatively upsized, and the processing chambers are added, a footprint is inevitably bloated. In addition, when exhaust flow is varied among the processing chambers, variations in ashing rate or in uniformity of film processing are resulted.

SUMMARY OF THE INVENTION

It is an object of the invention to provide a substrate processing apparatus and a substrate processing method which achieve both high throughput and small footprint, which are opposite conditions, and ensures resist removing uniformity of film of wafers.

According to an aspect of the invention, there is provided a substrate processing apparatus including: a processing chamber that processes a substrate, a substrate placing base enclosed in the processing chamber, a substrate transporting member that allows the substrate to wait temporarily on the substrate placing base, exhaust holes provided so as to surround the substrate placing base, and a retracting space that allows the substrate transporting member to move in between a line connecting the exhaust hole and an upper end of the substrate placing base and the substrate placing base.

According to another aspect of the invention, there is provided a substrate processing method including the steps of: moving a substrate to above a first substrate placing base in a processing chamber by a first substrate transporting member provided in a transporting chamber; transferring the substrate from the first substrate transporting member to a first substrate supporting portion and a second substrate transporting member; moving the second substrate transporting member to a position above the second substrate placing base and waiting at the position above the second substrate placing base; placing the substrate on the second substrate placing base while moving the second substrate transporting member in a retracting space provided between a line connecting an end of an exhaust hole and an upper end of the second substrate placing base provided so as to surround the second substrate placing base and the second substrate placing base; and exhausting gas from the exhaust holes while supplying the processing gas to the processing chamber and processing the substrate.

According to the invention, a substrate processing apparatus and a substrate processing method which achieve both high throughput and small footprint, which are opposite conditions, and ensures resist removing uniformity of wafers are provided.

DETAILED DESCRIPTION OF THE INVENTION

Referring now to the drawings, an embodiment of the invention will be described.

Figure 1:
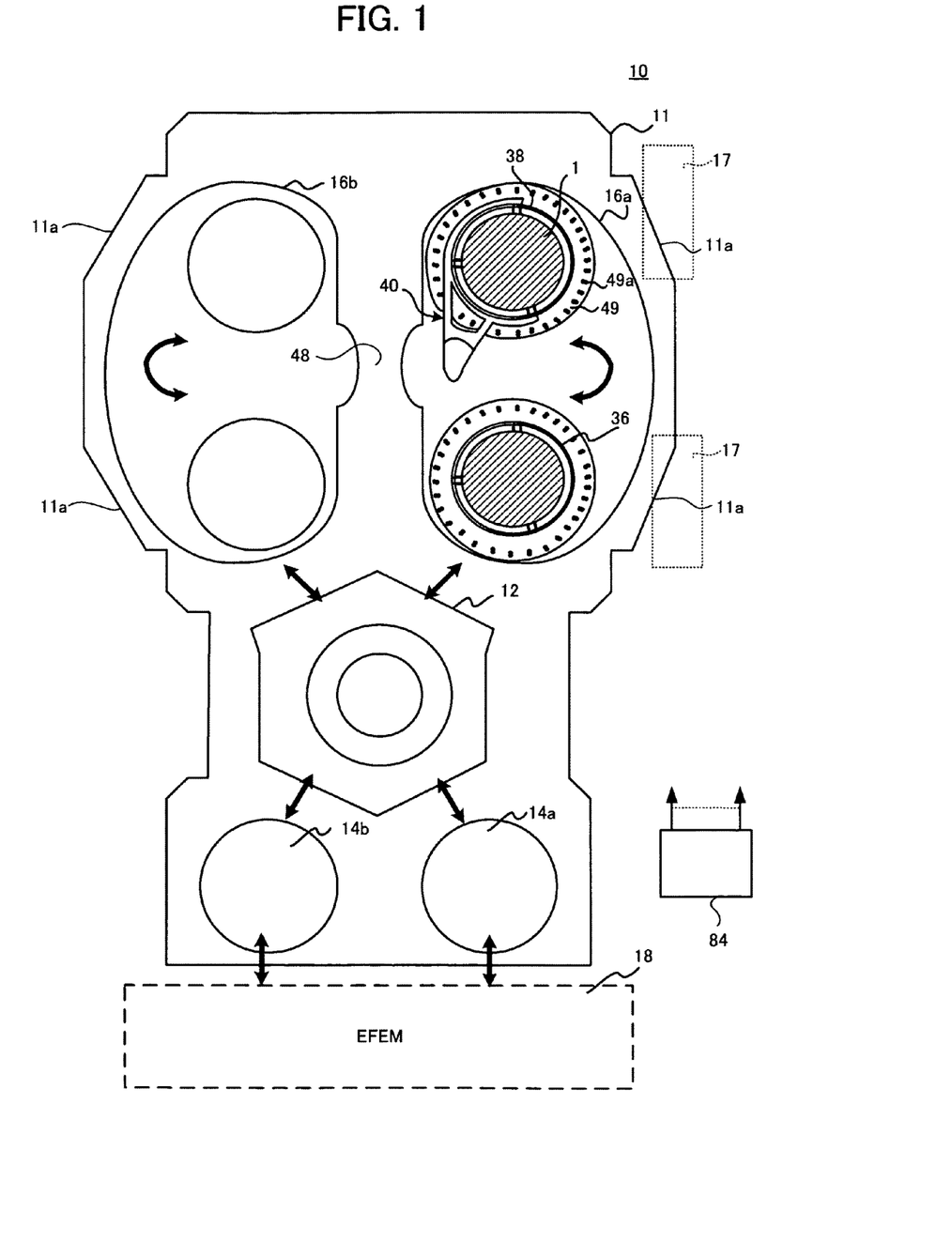
FIG. 1 is a general configuration drawing of a substrate processing apparatus used in an embodiment of the invention, and is a conceptual diagram viewed from above.

FIG. 1 is a general configuration drawing of a substrate processing apparatus 10 according to the embodiment of the invention, and is a conceptual diagram viewed from above the apparatus 10.

The substrate processing apparatus 10 includes a transporting chamber 12 arranged at the center, and two load lock chambers 14a and 14b and two processing chambers 16a and 16b on both sides thereof, and an EFEM (Equipment Front End Module) 18 as a front module is arranged on the upstream side of the load lock chambers 14a and 14b.

The EFEM 18 has a structure which accommodates three FOUPs (Front-Opening Unified Pod) that stores wafers 1 (25 pieces).

The EFEM 18 includes an atmosphere robot (not shown) which is able to transfer a plurality of (five) wafers simultaneously in the atmosphere placed therein, so that wafer transfer between the two load lock chambers 14a and 14b is enabled.

Figure 2:
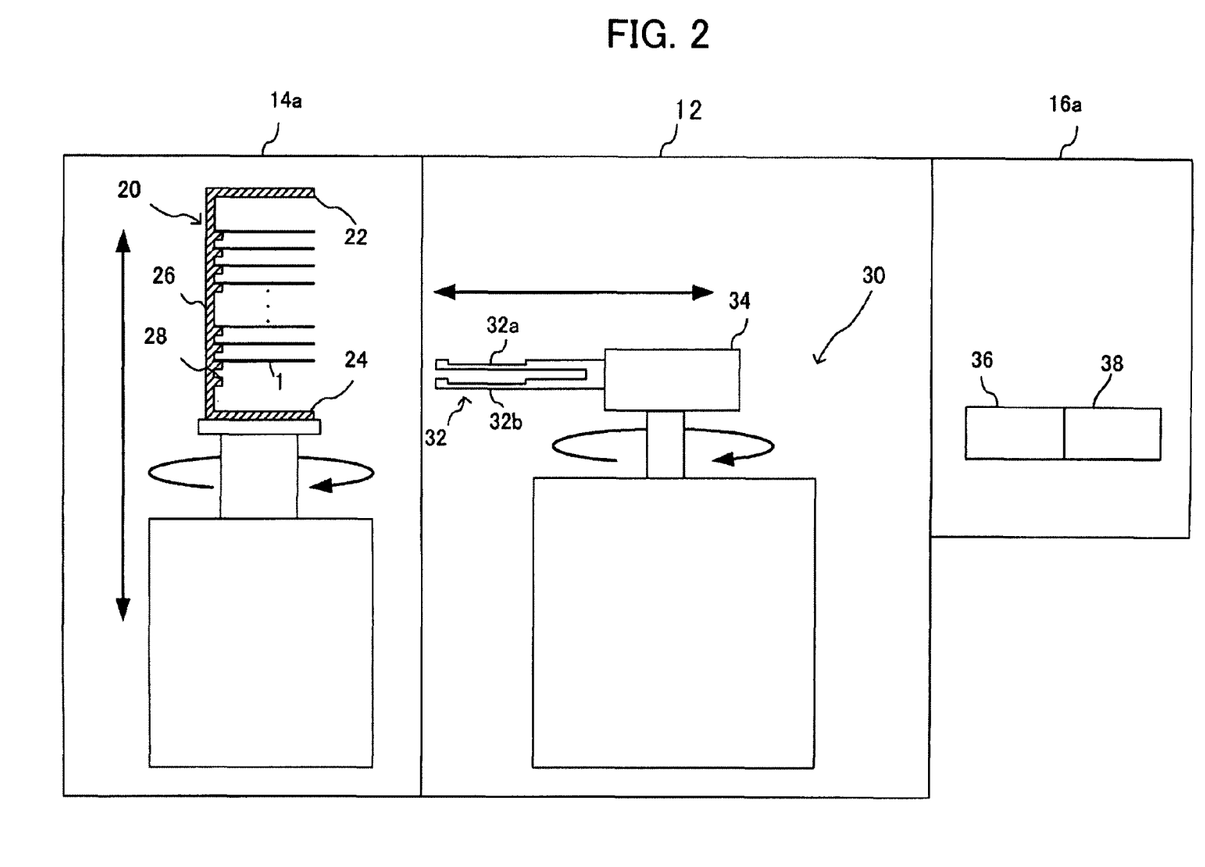
FIG. 2 is a vertical cross-sectional view of the general configuration drawing of the substrate processing apparatus used in the embodiment of the invention.

As shown in FIG. 2, the load lock chambers 14a and 14b each are provided with a substrate supporting member (boat) 20 that stores, for example, twenty-five substrates at a regular pitch in the vertical direction. The substrate supporting member 20 is made of, for example, silicon carbide or aluminum, and includes, for example, three supporting columns 26 that connect an upper plate 22 and a lower plate 24. The supporting columns 26 each are formed with, for example, twenty-five placing portions 28 in parallel inside in terms of the longitudinal direction. The substrate supporting members 20 are configured to move in the vertical direction (move upward and downward) in the load lock chambers 14a and 14b, and rotate about axes of rotation extending in the vertical direction.

Figure 3:
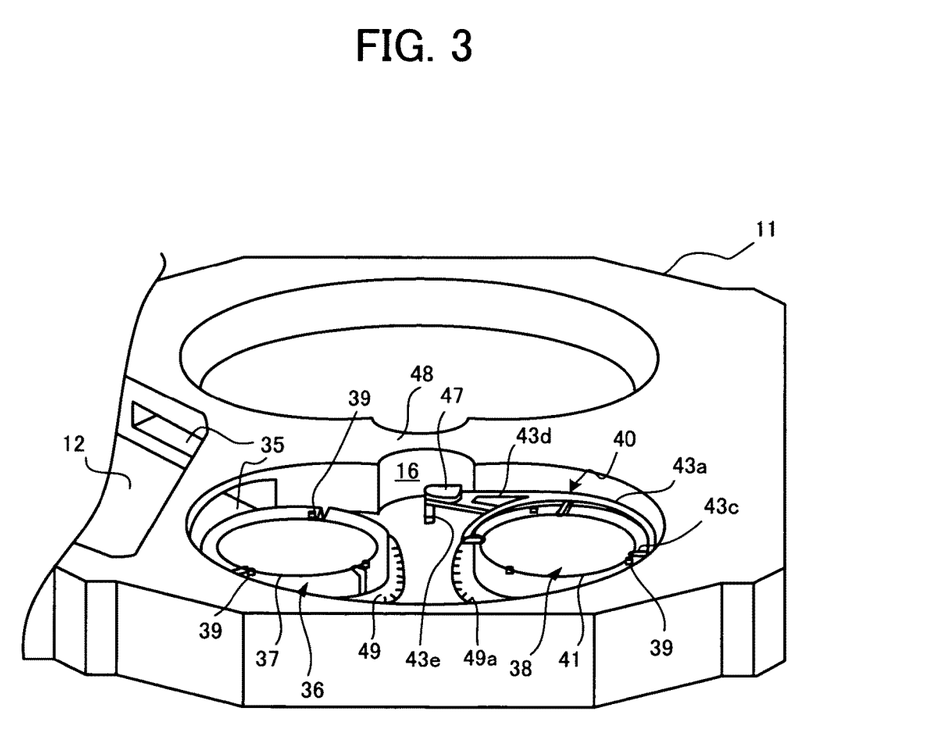
FIG. 3 is a perspective view of a processing chamber of the substrate processing apparatus according to the embodiment of the invention.

The transporting chamber 12 is provided with a first substrate transporting member 30 that transports the wafers 1 between the load lock chambers 14a and 14b and the processing chambers 16a and 16b. The first substrate transporting member 30 includes an arm 34 provided with a finger pair 32 having an upper finger 32a and a lower finger 32b. The upper finger 32a and the lower finger 32b have, for example, the same shape, are positioned apart from each other at a predetermined distance in the vertical direction, and extend from the arm respectively in the same direction substantially horizontally so as to support the wafers 1. The arm 34 is configured to rotate about an axis of rotation extending in the vertical direction, and to move in the horizontal direction. As shown in FIG. 3, the transporting chamber 12 and the processing chamber 16a, and the transporting chamber 12 and the processing chamber 16b are in communication with each other via gate valves 35, respectively: A boundary wall 48 is formed between the processing chambers 16a and 16b, therefore each the processing chambers are made independent atmosphere.

Therefore, two unprocessed wafers placed in stock respectively in the load lock chambers 14a and 14b are simultaneously transferred to the processing chambers 16a and 16b via the gate valves 35 by the first substrate transporting member 30 disposed on the transporting chamber 12. And two processed wafers are simultaneously transferred to the load lock chambers 14a and 14b from the processing chambers 16a and 16b by the first substrate transporting member 30.

FIG. 3 shows a rough sketch of the processing chamber 16.

The processing chamber 16 includes two susceptors disposed thereon, and includes a first processing unit 36 having a first substrate placing base 37 as the susceptor on the side of the transporting chamber 12 and a second processing unit 38 having a second substrate placing base 41 as the other susceptor.

The first processing unit 36 and the second processing unit 38 have independent structures respectively, and are arranged in a row in the same direction as the direction of flow of the wafer processing when viewed generally as an entire apparatus.

In other words, the second processing unit 38 is arranged on the far side from the transporting chamber 12 with the intermediary of the first processing unit 36.

The first processing unit 36 and the second processing unit 38 communicate with each other and the temperature of the interior of the processing chamber 16 can be raised to 300° C.

The first processing unit 36 and the second processing unit 38 are made, for example, of aluminum (A5052, A5056, etc.), and is heated by a heater (not shown) inserted therein.

In order to achieve the objects of small footprint and cost down, the load lock chambers 14a and 14b, the transporting chamber 12, and the processing chambers 16a and 16b may be formed into one component with, for example, aluminum (A5052).

The first substrate placing base 37 and the second substrate placing base 41 are fixed to an apparatus body 11 by a fixing member (not shown) in the processing chamber 16. Also, three each of substrate holding pins 39 are provided on outer peripheries of the first substrate placing base 37 and the second substrate placing base 41 so as to penetrate therethrough in the vertical direction, and the substrate holding pins move upward and downward to move the substrate upward and downward in substantially horizontal position. Therefore, it is configured in such a manner that the wafer transported by the first substrate transporting member 30 via the gate valve 35 is placed on the processing unit via the substrate holding pins 39. In other words, by the control of a control unit 84, a motor is rotated in the normal and reverse directions, so that the substrate holding pins 39 are moved upward and downward.

A second substrate transporting member 40 is provided between the first processing unit 36 and the second processing unit 38 in the processing chamber 16 on the inner side, in other words, near the boundary wall side. The second substrate transporting member 40 transfers one of the two unprocessed wafers on the first processing unit 36 transported by the first substrate transporting member 30 to the second substrate placing base 41 of the second processing unit 38, and then the processed wafer on the second substrate placing base 41 is transferred onto the finger of the first substrate transporting member 30.

Figure 4:
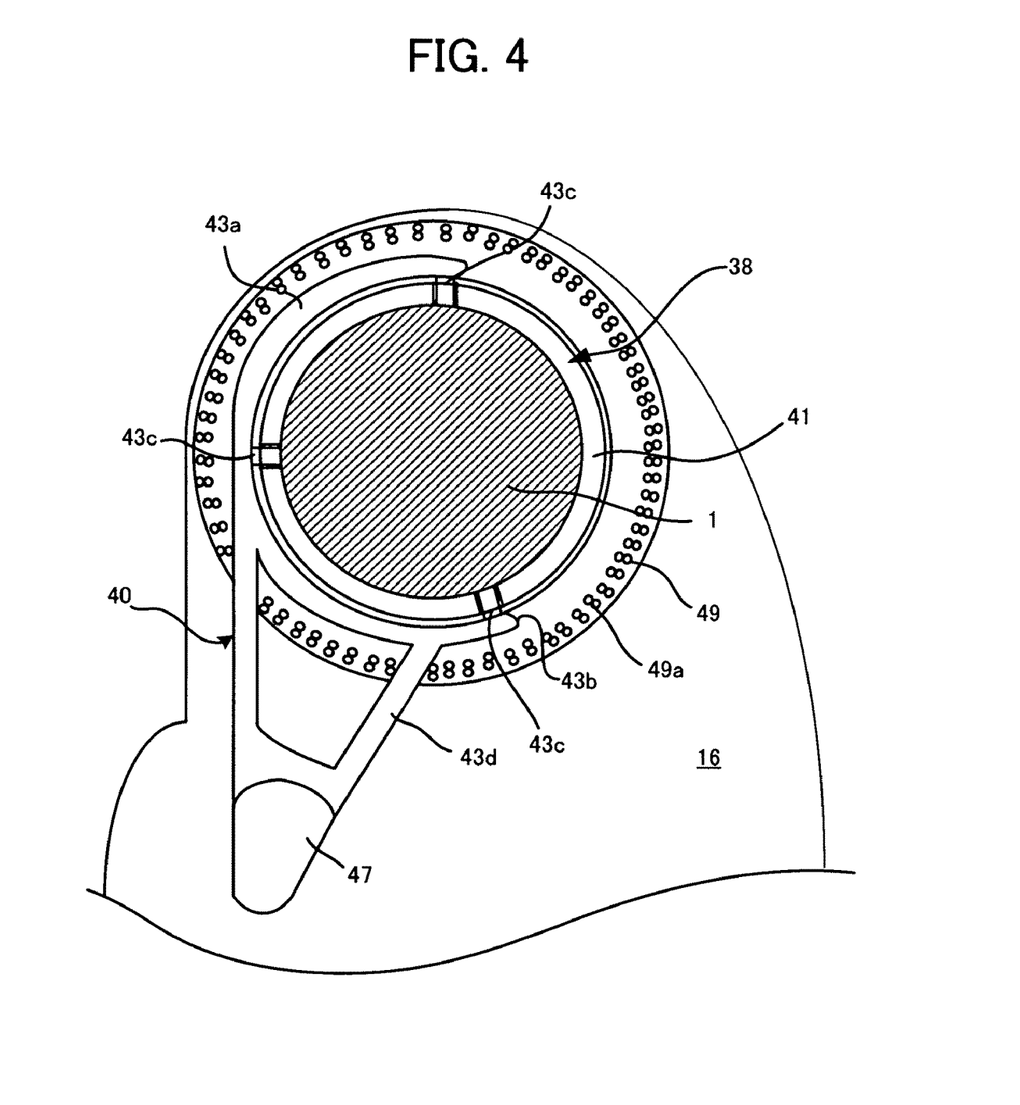
FIG. 4 is a top view of a periphery of a second substrate transporting member during a substrate processing according to the embodiment of the invention.

FIG. 4 shows the second substrate transporting member 40 in the processing chamber 16 in a state of waiting (during the substrate processing) on the side of the second processing unit 38.

The second substrate transporting member 40 includes an arcuate portion 43a as a substrate placing portion larger than the outer diameter of the wafer 1, a cutting lack portion 43b lacked from the arcuate portion 43a, claw portions 43c extending from the arcuate portion 43a substantially horizontally toward the center of the arcuate portion and being configured to place the wafer thereon, and an arm 47 having a frame portion 43d as a supporting portion that supports the arcuate portion 43a.

The arcuate portion 43a and the frame portion 43d are formed continuously, and are mounted so as to extend substantially horizontally from the arm 47, so as to support the wafer 1 via the claw portions 43c.

The arm 47 is configured to rotate about a shaft portion 43e as an axis of rotation extending in the vertical direction, and to move upward and downward in the vertical direction.

The cutting lack portion 43b is arranged at a position which opposes the gate valve 35 provided between the transporting chamber 12 and the processing chamber 16 when the shaft portion 43e rotates and hence the second substrate transporting member 40 is positioned on the side of the first processing unit 36.

Therefore, by the rotation and upward and downward movement of the shaft portion 43e as the axis of rotation, the second substrate transporting member 40 is capable of transporting and placing one of two wafers transported into the processing chamber 16 by the first substrate transporting member 30 from above the first substrate placing base 37 of the first processing unit 36 to the second substrate placing base 41 of the second processing unit 38 located on the far side from the transporting chamber 12.

Since the temperature of the second substrate transporting member 40 rises to a high temperature (approximately 250° C.) due to temperature radiation from the first substrate placing base 37 and the second substrate placing base 41, it is preferably formed of, for example, alumina ceramics (a purity of 99.6% or higher). By forming the second substrate transporting member 40 of, for example, alumina ceramics (a purity of 99.6% or higher), which has a smaller coefficient of thermal expansion than metallic components, deterioration of reliability of transportation due to bending by thermal deformation is prevented. However, a metallic component is used for a proximal portion of the second substrate transporting member 40 for adjusting the heightwise position and the horizontal level.

The second substrate transport member 40 rotates by centering on a shaft portion 43e and the shaft portion 43e is arranged in the boundary wall 48 side.

The second substrate transport member 40 in the other processing chamber places the boundary wall 48 and is arranged contrasting it with the second substrate transport member 40 in the one processing chamber. It becomes possible to set the lower side of the processing chamber and to the center of the device in horizontal direction, that is, the vicinity of the boundary wall, by concentrating wiring to control the second substrate transport member 40 to arrange it contrasting it. This result, it becomes possible to install by concentrating the wirings of each parts, and the wiring space can be made efficiency. Also, because the second substrate transport member 40 rotates by centering on the shaft portion 43e arranged in the vicinity of the boundary wall 48, the processing chamber externals can be assumed to be a circle. As a result, it becomes possible to make the shape 11a of the main body 11 diagonally and the maintenance space that those who maintain it enter can be secured more widely. If the shaft portion 43e arranged in the outside of the processing chamber 16, it becomes impossible to make the shape 11a of the main body 11 diagonally and the maintenance space that those who maintain it enter can not be secured more widely.

Baffle rings 49 are provided on the outer peripheries of the first substrate placing base 37 and the second substrate placing base 41, respectively. The baffle ring 49 is a ring-shaped plate having a thickness of approximately 2 to 5 mm, and is generally formed to be divided into two or three parts considering the convenience of maintenance. Also, a plurality of vent holes 49a that exhaust gas in the processing chambers are formed in the outer peripheral portions of the baffle rings 49. In other words, a vent hole group is formed into a ring shape so as to surround uniformly the substrate placing base at a desired distance from the outer periphery of the each substrate placing base. If the desired distance is not provided from the substrate placing base, turbulence of the flow of the exhaust air occurs, and the exhaust efficiency is lowered as a result. Also, by providing the vent holes 49a in the ring shape, air is exhausted uniformly. The two vent holes 49a each are aligned toward the centers of the first substrate placing base 37 and the second substrate placing base 41, and are arranged at positions which form rings having a larger diameter than the outer diameter of the arcuate portion 43a of the second substrate transporting member 40 when the second substrate transporting member 40 is moved in a retracting space described later. More specifically, the outer diameter of the arcuate portion 43a is, for example, approximately $\phi$380 to 390 mm, and the vent holes 49a are arranged along a circle of, for example, approximately $\phi$420 to 435 mm. The higher exhaust efficiency is achieved by making the diameter of the vent holes 49a arranged on the side closer to the substrate placing base larger.

Figure 5:
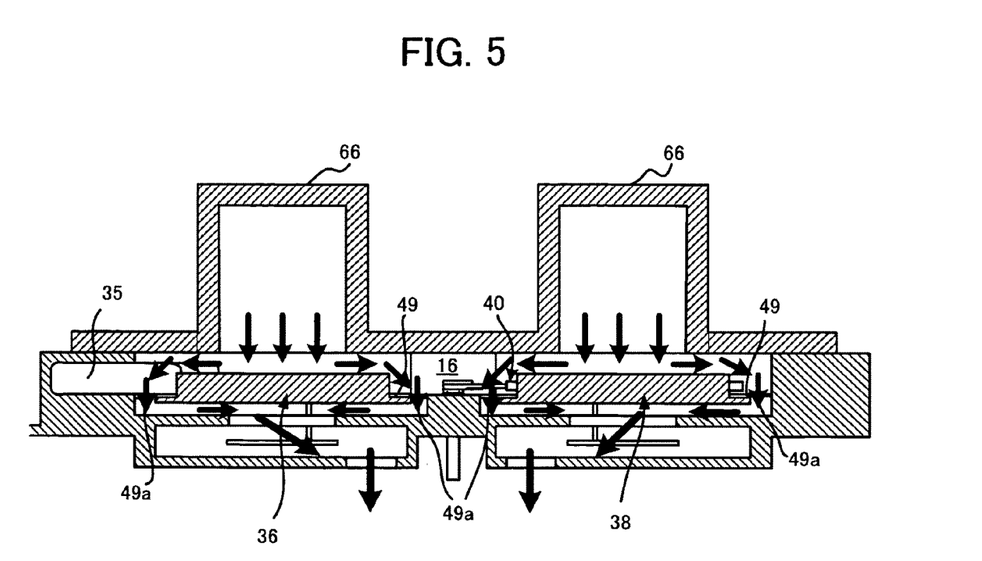
FIG. 5 is a diagram showing a gas flow in the processing chamber according to the embodiment of the invention.

FIG. 5 is a diagram showing the gas flow.

$O_2$ gas is introduced into plasma generating units 66 placed above the first processing unit 36 and the second processing unit 38 and activated therein, and is decomposed into $O_2$ plasma, radical, and the like. The apparatus in the invention is configured to supply only radical, which gives less damage to the wafers, to the wafers. The gas supplied to the first processing unit 36 and the second processing unit 38 reaches the baffle rings 49 placed on the outer peripheries of the first processing unit 36 and the second processing unit 38, and is exhausted through the vent holes 49a provided in the outer peripheral portions of the baffle rings 49. The gas conductance of the vent holes 49a is the smallest in the processing chamber 16 and hence the uniformity of the gas flow within the wafer surface (the turbulence of the gas flow in the circumferential direction) is determined by the vent holes 49a. There exist portions which are asymmetry and hence might hinder the gas flow locally, such as the second substrate transporting member 40 in the periphery of the second processing unit 38. Therefore, the uniformity of the gas flow is ensured additionally by a countermeasure as described later.

Figure 6:
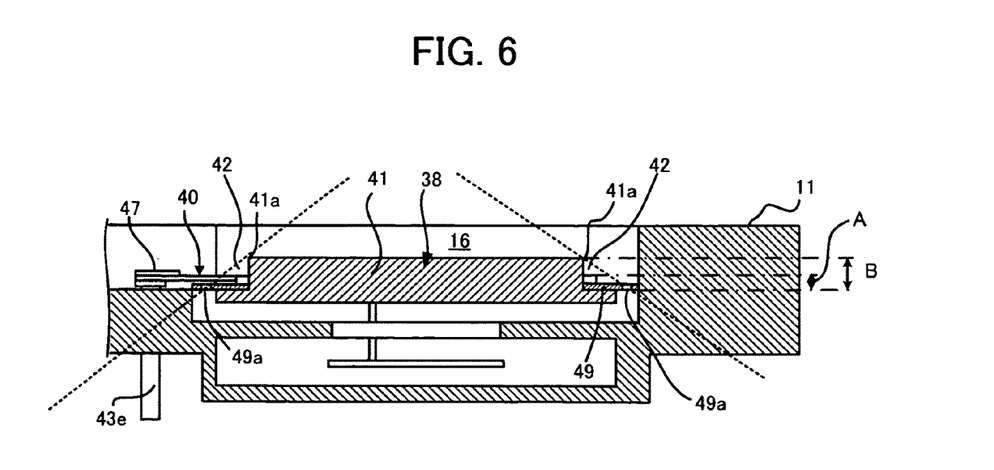
FIG. 6 is a vertical cross-sectional view of a periphery of the second substrate transporting member during the substrate processing according to the embodiment of the invention.

FIG. 6 is a cross-sectional view of a portion in the periphery of the second substrate transporting member 40.

The second substrate transporting member 40 has an opening (cutting lack portion 43b) in the circumferential direction for allowing giving and receiving of the wafers with respect to the first substrate transporting member 30.

Since the second substrate transporting member 40 is positioned substantially at the intermediate position between the first processing unit 36 and the second processing unit 38 in terms of the gas flow, it is needed to be moved to a position which gives less hindrance to the gas flow. More specifically, the second substrate transporting member 40 is moved to a retracting space 42 that is a terminal part of the second substrate placing base 41 and provided in outer of the second substrate placing base 41. Accordingly the second substrate transporting member 40 can reduce the influence of the gas flow obstruction. Moreover better, the second substrate transporting member 40 is moved to a position between a line connecting an upper end of the vent holes 49a on the side of the second substrate placing base 41 and a corner portion 41a of the second substrate placing base 41 and the second substrate placing base 41 (the retracting space), and on the outer periphery of the second substrate placing base 41. In other words, the second substrate transporting member 40 is moved downward to a level lower than the broken lines shown in FIG. 6. Accordingly, and what's more, the gas (plasma) is uniformized on the second processing unit 38, and the second substrate transporting member 40 does not hinder the gas exhaust, so that the uniform exhaust of gas is achieved, and the ashing of the wafers placed on the second processing unit is uniformized. Also, since the second substrate transporting member 40 by itself has a thickness (for example, approximately 8 to 10 mm), the relation $A<B/2$, where A is a distance from an upper surface of the second substrate transporting member 40 to a bottom surface of the second processing unit 38 and B is a distance from an upper surface of the second processing unit 38 to the bottom surface of the second processing unit 38, is preferable.

Figure 7A:
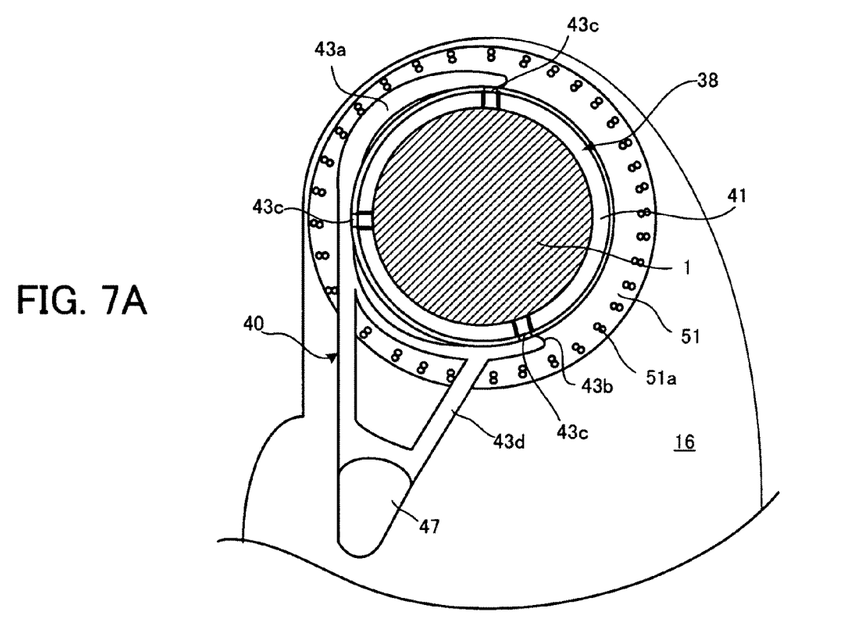
FIG. 7A is a top view of a periphery of a baffle ring of the second substrate transporting member during the substrate processing according to a comparative example.
Figure 7B:
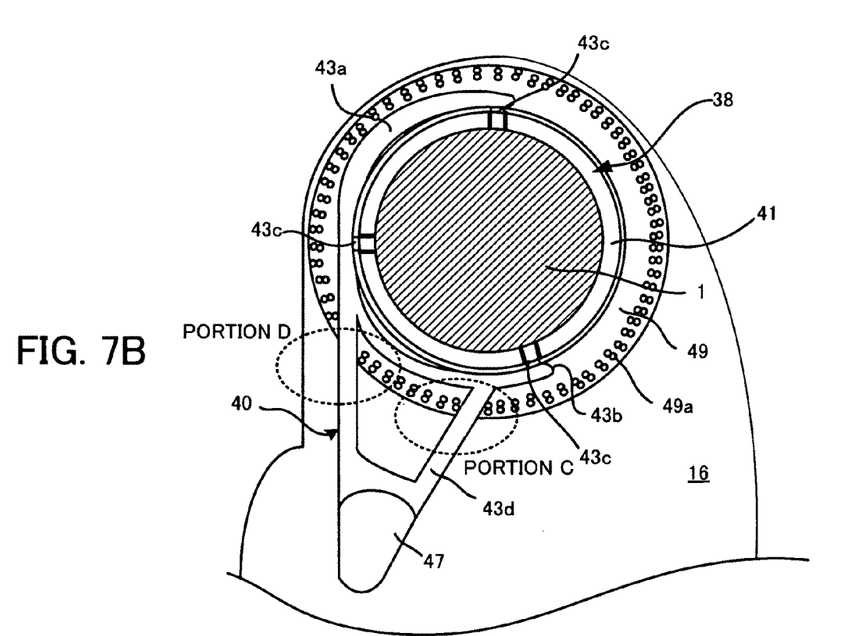
FIG. 7B is a top view of the periphery of a baffle ring of the second substrate transporting member during the substrate processing according to the embodiment of the invention.

FIG. 7A is a top view of a periphery of a baffle ring of the second substrate transporting member during the substrate processing according to a comparative example, and FIG. 7B is a top view of the periphery of a baffle ring of the second substrate transporting member during the substrate processing according to the embodiment of the invention.

A baffle ring 51 according to the comparative example shown in FIG. 7A includes sixty-four exhaust holes 51a having a diameter of ϕ4.5 mm formed at a pitch angle of 11.3° in the circumferential direction.

The baffle ring 51 according to the comparative example is configured so that the frame portion 43d of the second substrate transporting member 40 are arranged so as not to occlude the exhaust holes 51a. Therefore, the number of holes and the pitch dimension in the circumferential direction are limited, and control of the quantity of the exhaust gas per hole becomes difficult, so that a phenomenon in which uniformity is deteriorated by the influence of the assembly or machine errors occurred.

The baffle ring 49 shown in FIG. 7B according to the embodiment of the invention includes 720 exhaust holes 49a having a diameter of ϕ2.5 mm formed at a pitch angle of 2° in the circumferential direction.

Portions C and D in FIG. 7B correspond to portions where the exhaust conductance is shielded by the frame portion 43d of the second substrate transporting member 40. More specifically, the number of holes which are shielded is approximately twelve in the portion C and approximately seven in the portion D, and the percentages of the shielded holes with respect to the entire number of holes are 1.7% in the portion C and 1.0% in the portion D. In the case of this shape, the total conductance of the holes corresponds to the total sum of the conductance of the respective holes. Therefore, the percentage of the number of shielded holes may be considered to be equal to the percentage of conductance.

Figure 8A:
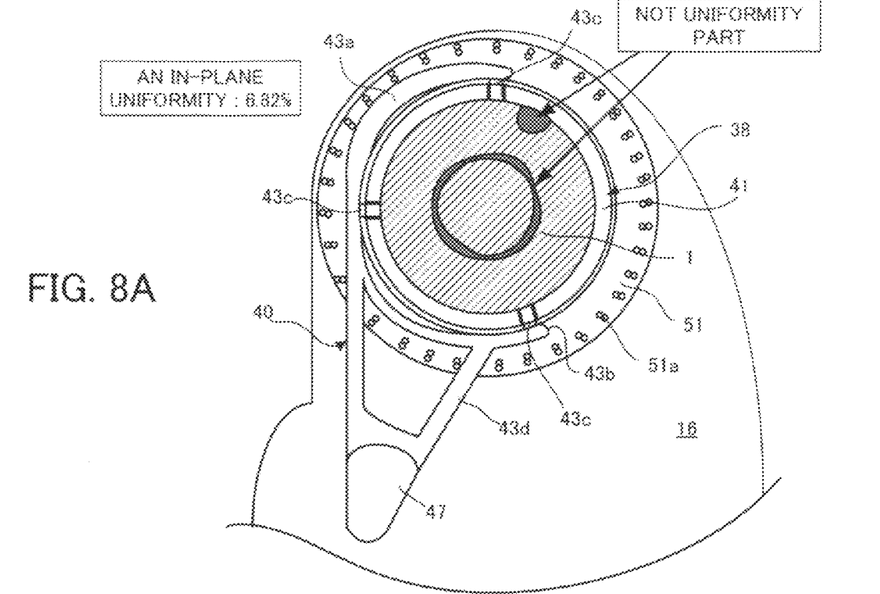
FIG. 8A is an in-plate ashing rate uniformity when using the baffle ring according to a comparative example.
Figure 8B:
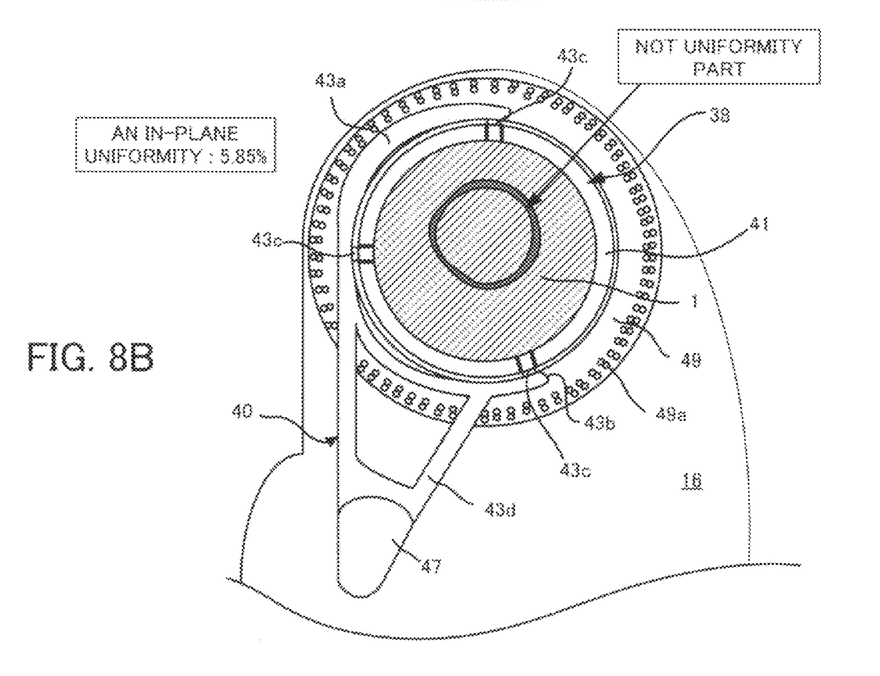
FIG. 8B is an in-plate ashing rate uniformity when using the baffle ring according to the embodiment of the invention.

As a result of ashing using the baffle ring 51 according to the comparative example in FIG. 7A and the baffle ring 49 according to the embodiment of the invention under the same conditions other than the baffle ring, as shown in FIG. 8A an in-plane ashing rate uniformity of about 6 to 7% was obtained when using the baffle ring 51 according to the comparative example, as shown in FIG. 8B while the in-plane ashing rate uniformity of about 5 to 6% was obtained when using the baffle ring 49 according to the embodiment of the invention, which proved the effect of improvement of the uniformity.

In other words, by shielding the exhaust holes at the percentage higher than 0% and not exceeding 3% of the total exhaust conductance by the frame portion 43d of the second substrate transporting member 40 when the second substrate transporting member 40 is moved in the above-described retracting space, the in-plane ashing rate uniformity is improved. Also, by shielding the exhaust holes at the percentage higher than 0% and not exceeding 2% of the total exhaust conductance by one supporting portion of the frame portion 43d which includes the two supporting portions when the second substrate transporting member 40 is moved in the above-described retracting space, the in-plane ashing rate uniformity is improved. In other words, the in-plane ashing rate uniformity can be changed with the equivalent number of components without changing the principal component such as the second substrate transporting member 40, and the ashing of the wafers may be uniformized while maintaining the same operating efficiency.

Figure 9:
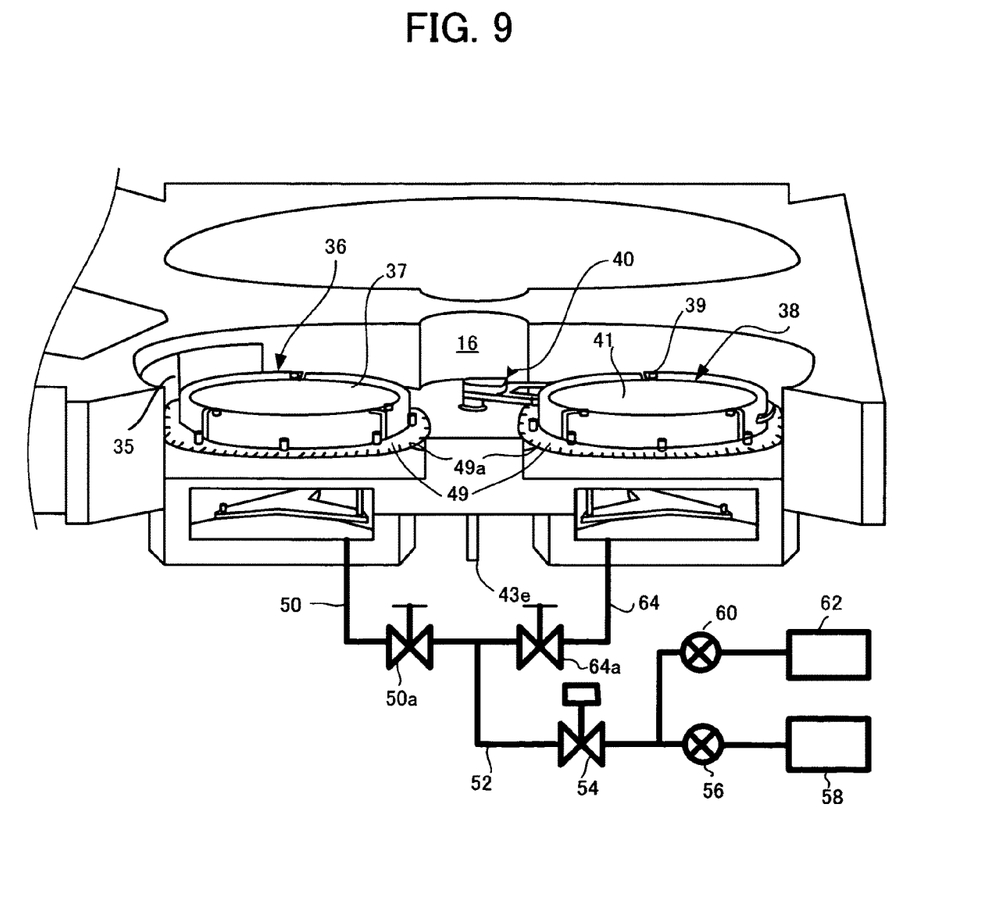
FIG. 9 is a system diagram showing an exhaust system in the processing chamber according to the embodiment of the invention; and FIG. 10A to FIG. 10C is a perspective view showing a flow of wafer transfer in the processing chamber according to the embodiment of the invention.

FIG. 9 is a system diagram showing an exhaust system in the processing chamber 16.

The lower side of the first processing unit 36 is connected to a pump 58 via a first piping 50 that exhausts the gas, a first valve 50a, a second piping 52, an APC valve 54, and a main valve 56 and to a vent 62 via the APC valve 54 and an air valve 60.

Therefore, the gas in the periphery of the first processing unit 36 passes through the vent holes 49a, and is exhausted from the lower side of the first processing unit 36 to the pump 58 via the first piping 50, the first valve 50a, the second piping 52, the APC valve 54, and the main valve 56, and is exhausted to the vent 62 via the first piping 50, the first valve 50a, the second piping 52, the APC valve 54, and the air valve 60.

The lower side of the second processing unit 38 is connected to the pump 58 via a third piping 64 that exhausts the gas, a second valve 64a, the second piping 52, the APC valve 54, and the main valve 56 and to the vent 62 via the APC valve 54 and the air valve 60.

Therefore, the gas in the periphery of the second processing unit 38 passes through the vent holes 49a, and is exhausted from the lower side of the second processing unit 38 to the pump 58 via the third piping 64, the second valve 64a, the second piping 52, the APC valve 54, and the main valve 56, and is exhausted to the vent 62 via the third piping 64, the second valve 64a, the second piping 52, the APC valve 54, and the air valve 60.

The interior of the processing chamber 16 is connected to the pump 58, and reaches a vacuum of approximately 0.1 Pa as a goal. Therefore, a vacuum shielding structure with respect to the atmosphere is needed in the shaft portion 43e of the second substrate transporting member 40 and, in this apparatus, a vacuum shielding is achieved by placing magnetic seals on the shaft portion 43e and an arm drive motor (not shown). In addition, magnetic seal portions are water-cooled as a countermeasure for heat.

The pump 58 to be connected to the processing chamber 16 generally requires a specification of a level from 10000 to 20000 l/min, and hence the cost is significantly high. Therefore, in order to reduce the number of pumps to be used as much as possible, the pump 58 to be connected to the first processing unit 36 and the second processing unit 38 as described above is commonly used.

Since supply gas is intended to remove resist, activated $O_2$ gas, for example, is introduced. The gas flow rate is, for example, 2 to 15 slm, and the process pressure is set to a range from 100 to 1000 Pa, for example. For the convenience of the conductance, the inner diameter of the exhaust pipe is, for example, approximately from ϕ80 to 100 mm, in order to maintain this pressure range.

The first valve 50a and the second valve 64a placed before merging are preferably manual valves, and generally, those of a butterfly type, having an opening adjusting function from 0 to 90° in increments of 0.3 to 0.5° are employed. By employing the first valve 50a and the second valve 64a, individual difference (flow rate accuracy, setting ±3%) of MFC (Mass Flow Controller) used for the supply gas, and ashing rate difference between the first processing unit 36 and the second processing unit 38 due to an influence on the gas flow due to the waiting of the second substrate transporting member (on the side of the second processing unit), or an influence of assembly error or the like are alleviated. The gas after the merging is exhausted by the pump 58 via the APC valve 54 and the main valve 56 which are automatic pressure adjusting devices. The exhaust conductance of the each unit employed here is larger than 200 L/s. In general, a pressure meter (capacitance manometer or the like) is installed in the vicinity of the APC valve 54 (not shown), and the pressure adjustment to a desired pressure value (process condition, and so on) is allowed.

Figure 10A:
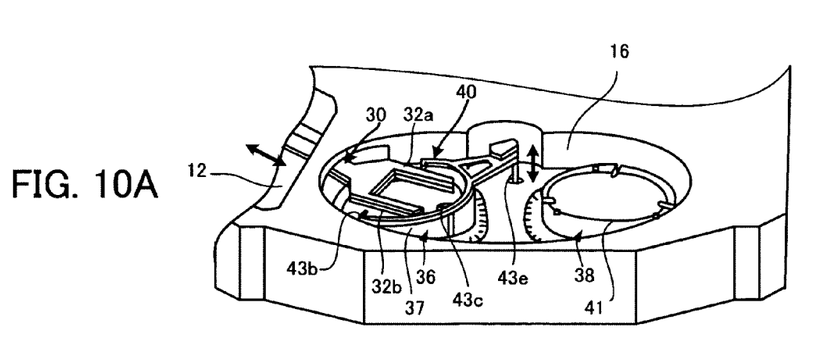
Figure 10B:
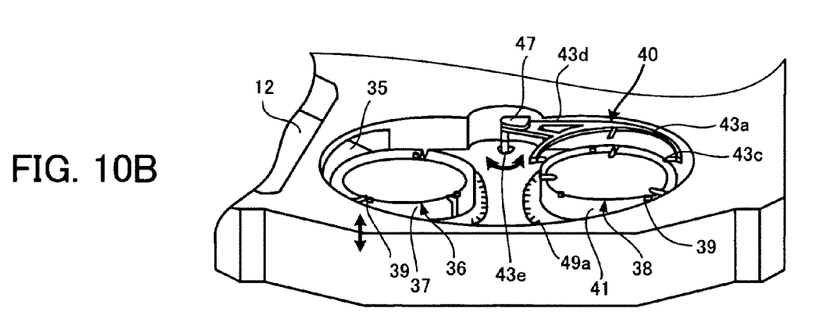
Figure 10C:
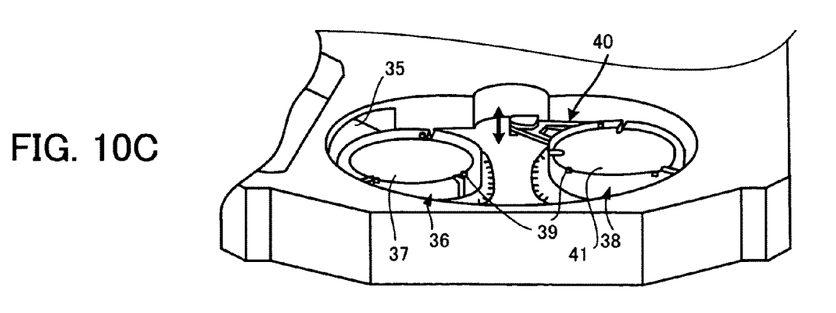

FIG. 10A to FIG. 10C shows an outline of a flow of wafer transfer in the processing chamber 16.

In the following description, the action of the respective components which constitute the substrate processing apparatus 10 are controlled by a controller 84.

However, the wafers are not shown for the convenience for securing the visibility of the interior of the processing chamber 16.

Step 1

The first substrate transporting member 30 is moved from the transporting chamber 12 to the processing chamber 16 via the gate valve 35 while transporting the two wafers placed on the upper finger 32a and the lower finger 32b simultaneously, and is stopped above the first substrate placing base 37 of the first processing unit 36. At this time, the second substrate transporting member 40 waits at a level within a range between the upper finger 32a and the lower finger 32b of the finger pair 32. The substrate holding pins 39 of the first substrate placing base 37 move upward while the first substrate transporting member 30 is not operated as is, and the wafer placed on the lower finger 32b is placed on the substrate holding pins 39 of the first substrate placing base 37. In addition, by the upward movement of the second substrate transporting member 40, the wafer placed on the upper finger 32a is placed on the claw portions 43c of the second substrate transporting member 40.

Step 2

Then, the procedure goes to an operation to place the respective wafers on the substrate placing bases of the first processing unit 36 and the second processing unit 38. In the first substrate placing base 37, the substrate holding pins 39 are moved downward to place the wafer as is on the first substrate placing base 37. The second substrate transporting member 40 rotates substantially horizontally to a position above the second substrate placing base 41 of the second processing unit 38, then, the substrate holding pins 39 of the second substrate placing base 41 are moved upward, and the wafer placed on the second substrate transporting member 40 is transferred onto the substrate holding pins 39 of the second substrate placing base 41. Then, the first substrate transporting member 30 is returned to the interior of the transporting chamber 12.

Step 3

The operation of the second substrate transporting member 40 after having transferred the wafer to the second processing unit 38 will be described. Since the second substrate transporting member 40 waits in the processing chamber 16 also during the wafer processing, it might hinder the gas flow of the processing gas (for example, $O_2$ radical or the like) supplied from above the second processing unit 38 and deteriorate the uniformity within the plane of the wafer. Therefore, the second substrate transporting member 40 is moved to a position between a line connecting an upper end of the vent holes 49a of the second substrate placing base 41 on the side of the second substrate placing base 41 and the corner portion 41a of the second substrate placing base 41 and the second substrate placing base 41 (the retracting space), and on the outer periphery of the second substrate placing base 41. In other words, the second substrate transporting member 40 is moved downward to a level lower than the broken lines shown in FIG. 6.

After the substrate processing, the sequence is reversely performed.

According to the invention, the gas flow structure with high uniformity is build, a highly uniform in-plane ashing distribution of the wafer is ensured, and wafer resist removal uniformity is secured while achieving the small footprint and the high throughput (250 pieces per hour) in comparison with the related art.

The invention relates to a semiconductor manufacturing technology and, more specifically, a thermal processing technology in which substrates to be processed are stored in the processing chamber and performing the process in a state of heating with a heater, and is applicable to those which are effectively used for substrate processing apparatuses used for, for example, applying oxidization treatment or diffusion treatment, reflow or anneal for activating carrier after ion implantation or flattening, or film-forming process by a heat CVD reaction on semiconductor wafers on which a semiconductor integrated circuit device (semiconductor device) is built in.

According to still another aspect of the invention, there is provided a substrate processing apparatus including a transporting chamber that transports a substrate, and a processing chamber that receives the substrate from the transporting chamber and processes the same, in which the transporting chamber includes a first substrate transporting member that transports the substrate from the transporting chamber to the processing chamber, the processing chamber includes a first processing unit being positioned adjacent to the transporting chamber and having a first substrate placing base, a second processing unit being positioned adjacent to the first processing unit on the side different from the transporting chamber and having a second substrate placing base, a second substrate transporting member that transports the substrate between the first processing unit and the second processing unit, a group of exhaust holes provided so as to surround the second substrate placing base, and a retracting space that allows the second substrate transporting member to retract therein and is formed between lines each connecting an end of the each exhaust hole and an upper end of the second substrate placing base and the second substrate placing base. Accordingly, the second substrate transporting member does not hinder the gas exhaust, so that the uniform exhaust of gas is achieved, and the ashing of the wafers placed on the second substrate placing base is uniformized.

Preferably, the group of exhaust holes includes the exhaust holes arranged so as to surround the second substrate placing base uniformly.

Preferably, the retracting space is defined so as to avoid the second substrate transporting member from protruding from the lines each connecting the end of the each exhaust hole and the upper end of the second substrate placing base.

Preferably, the end of the each exhaust hole corresponds to an end of diameter of the exhaust hole which is closest to the second substrate placing base.

Preferably, the second substrate transporting member includes a shaft portion, a substrate placing portion that allows the substrate to be placed thereon, and a supporting portion that supports the substrate placing portion, and the supporting portion shields the exhaust holes at a percentage higher than 0% and not exceeding 3% of a total exhaust conductance of the group of exhaust holes when the second substrate transporting member is retracted in the retracting space.

Preferably, the second substrate transporting member includes the shaft portion, the substrate placing portion that allows the substrate to be placed thereon, and the supporting portion that supports the substrate placing portion, and the supporting portion shields the exhaust holes at least at two positions, and one position of the two shielded positions shields the exhaust holes at a percentage higher than 0% and not exceeding 2% of the total exhaust conductance of the group of exhaust holes when the second substrate transporting member is retracted in the retracting space.

What is claimed is:

1. A substrate processing apparatus comprising:
a processing chamber that processes a substrate;
a substrate placing base enclosed in the processing chamber;
a substrate transporting member that allows the substrate to wait temporarily on the substrate placing base;
a plurality of exhaust holes provided so as to surround the substrate placing base, and
a retracting space in which the substrate transporting member moves, the retracting space at least partly surrounding the substrate placing base and being disposed in the processing chamber inside a boundary that connects the plurality of exhaust holes to an upper end of the substrate placing base.

2. A substrate processing apparatus comprising:
a transporting chamber that transports a substrate; and
a processing chamber that receives the substrate from the transporting chamber and processes the received substrate, wherein
the transporting chamber includes a first substrate transporting member that transports the substrate from the transporting chamber to the processing chamber,
the processing chamber includes:
a first processing unit being positioned adjacent to the transporting chamber and having a first substrate placing base,
a second processing unit being positioned adjacent to the first processing unit on the side different from the transporting chamber and having a second substrate placing base,
a second substrate transporting member that transports the substrate between the first processing unit and the second processing unit,
a plurality of exhaust holes provided that surround the second substrate placing base, and
a retracting space in which the second substrate transporting member retracts, the retracting space at least partly surrounding the second substrate placing base and being disposed in the processing chamber inside a boundary that connects the plurality of exhaust holes to an upper end of the second substrate placing base.

3. The substrate processing apparatus according to claim 2, wherein the retracting space is defined so as to avoid the second substrate transporting member from protruding from the boundary.

4. The substrate processing apparatus according to claim 1, wherein the second substrate transporting member includes a shaft portion, a substrate placing portion that allows the substrate to be placed thereon, and a supporting portion that supports the substrate placing portion, and
the supporting portion shields the plurality of exhaust holes at a percentage higher than 0% and not exceeding 3% of a total exhaust conductance of the plurality of exhaust holes when the second substrate transporting member is retracted in the retracting space.

5. A substrate processing method comprising the steps of:
moving a substrate to above a first substrate placing base in a processing chamber by a first substrate transporting member provided in a transporting chamber;
transferring the substrate from the first substrate transporting member to a first substrate supporting portion and a second substrate transporting member;
moving the second substrate transporting member to a position above the second substrate placing base and waiting at the position above the second substrate placing base;
placing the substrate on the second substrate placing base while moving the second substrate transporting member in a retracting space that at least partly surrounds the second substrate placing base and is disposed in the processing chamber inside a boundary that connects the plurality of exhaust holes to an upper end of the second substrate placing base; and
exhausting gas from the plurality of exhaust holes while supplying the processing gas to the processing chamber and processing the substrate.

6. The substrate processing apparatus according to claim 2, wherein the second substrate transporting member includes a shaft portion, a substrate placing portion that allows the substrate to be placed thereon, and a supporting portion that supports the substrate placing portion, and
the supporting portion shields the plurality of exhaust holes at a percentage higher than 0% and not exceeding 3% of a total exhaust conductance of the plurality of exhaust holes when the second substrate transporting member is retracted in the retracting space.

* * * * *